United States Patent [19]

Tamura

[11] Patent Number: 5,012,303

[45] Date of Patent: Apr. 30, 1991

[54] SUPERCONDUCTING DEVICE

[75] Inventor: Hirotaka Tamura, Atsugi, Japan

[73] Assignee: Fujitsu Limited, Kawasaki, Japan

[21] Appl. No.: 478,030

[22] Filed: Feb. 9, 1990

Related U.S. Application Data

[63] Continuation of Ser. No. 364,316, Jun. 9, 1989, abandoned, which is a continuation of Ser. No. 937,455, Dec. 2, 1986, abandoned, which is a continuation of Ser. No. 676,826, Nov. 30, 1984, abandoned.

[30] Foreign Application Priority Data

Nov. 30, 1983 [JP] Japan ................................. 58-224311

[51] Int. Cl.$^5$ ..................... H01L 27/12; H01L 39/22; H01L 49/02; H01L 29/72
[52] U.S. Cl. ........................................... 357/5; 357/4; 357/6; 357/34
[58] Field of Search ........................... 357/4, 5, 6, 34; 307/306

[56] References Cited

U.S. PATENT DOCUMENTS

| 4,157,555 | 6/1979 | Gray | 357/6 |
| 4,334,158 | 6/1982 | Faris | 357/5 |
| 4,575,741 | 3/1986 | Frank | 357/65 |
| 4,589,001 | 11/1986 | Sakai et al. | 357/5 |

FOREIGN PATENT DOCUMENTS

| 57-18378 | 1/1982 | Japan | 357/5 |
| 57-76890 | 5/1982 | Japan | 357/5 |
| 57-106186 | 7/1982 | Japan | 357/5 |

OTHER PUBLICATIONS

Patent Abstracts of Japan, vol. 6, No. 155, Aug. 17, 1982–JP-A-57 76 890.

Primary Examiner—J. Carroll
Attorney, Agent, or Firm—Staas & Halsey

[57] ABSTRACT

A superconducting device including a base region of a superconductor, a region for injecting quasiparticles into the superconductor, and a collector region which captures the quasiparticles from the base region. The collector region substantially blocks Cooper pairs and has a barrier height over which the quasiparticles are passed.

1 Claim, 4 Drawing Sheets

SUPERCONDUCTING DEVICE

This is a continuation of copending application(s) Ser. No. 07/364,316 filed on June 9, 1989 which is a continuation of application Ser. No. 06/937,455, filed on Dec. 2, 1986, which is a continuation of application Ser. No. 06/676,826, filed Nov. 30, 1984, all now abandoned.

FIELD OF THE INVENTION

The present invention relates to a superconducting device and, more particularly to a superconducting device wherein signal amplification effects and switching operations similar to those of a semiconductor transistor can be obtained.

Typical electronic devices using superconductivity are cryotrons and Josephson tunneling devices. In cryotrons, the superconductive gap $\Delta$ of a thin film can be eliminated by passing a current larger than the critical current through the film, applying an external magnetic field thereto, heating the film, or otherwise breaking the superconductive state of the film. Cryotrons, however, suffer from a slow switching speed, e.g., a few $\mu$sec, so have not come into commercial use.

In Josephson tunneling devices, a current of zero volts is passed between two superconductors isolated by an extremely thin tunnel barrier by the steps of passing current to the superconductors and applying an external magnetic field thereto. Josephson tunneling devices (referred to below as "Josephson devices") can be operated at high speed, so that studies have been conducted on possible application to switching elements. With Josephson devices, however, the circuit complexity makes it extremely difficult to form circuits with a high signal amplification factor and separated inputs and outputs as in semiconductor transistor circuits. Therefore, realization of a complex circuit having a large scale is more difficult with Josephson devices than with semiconductor transistors.

Known superconducting devices realizing signal amplification effects and switching operations similar to those of transistors include the superconducting transistor of Gray (cf: for example, K. E. Gray, *Applied Physics Letters* vol. 32 No. 6 (1978) pp. 392 to 395) and the Quiteron of Faris (cf: Japanese Unexamined Patent Publication (Kokai) No. 57-12575 corresponding to U.S. Pat. No. 4,334,158).

The superconducting devices of Gray and Faris are fundamentally similar in structure, in that they consist of three layers to provide a superconducting thin film and two tunnel junctions provided on and below the superconducting thin film. One of the tunnel junctions is used to inject quasiparticles into the superconducting thin film, and the other is used to obtain an output signal.

The devices of Gray and Faris, however, have small amplification factors. For example, published experiments shown that the transistor of Gray features a current gain of about 4 and a power gain of about 1 and that a Quiteron features a current gain of about 8 and power gain of about 2. Further, in these experiments, the signal voltage was disadvantageously attenuated in each case.

Further, the Gray transistor and the Faris Quiteron feature considerably long switching times, for example, 300 psec in the case of the Quiteron. The switching time depends on the time during which the over-populated stage of quasiparticles generated by injection of the quasiparticles is relaxed.

SUMMARY OF THE INVENTION

The object of the present invention is to eliminate the above disadvantages of the prior art and to provide a superconducting device having a considerably large signal amplification factor and a high switching speed.

According to the present invention, there is provided a superconducting device including a base region of a superconductor, means for injecting quasiparticles into the superconductor and a collector region which captures the quasiparticles from the base region, wherein the collector region substantially blocks Cooper pairs and has a barrier height over which the quasiparticles are passed.

DESCRIPTION OF THE PREFERRED EMBODIMENTS

Figure 1:
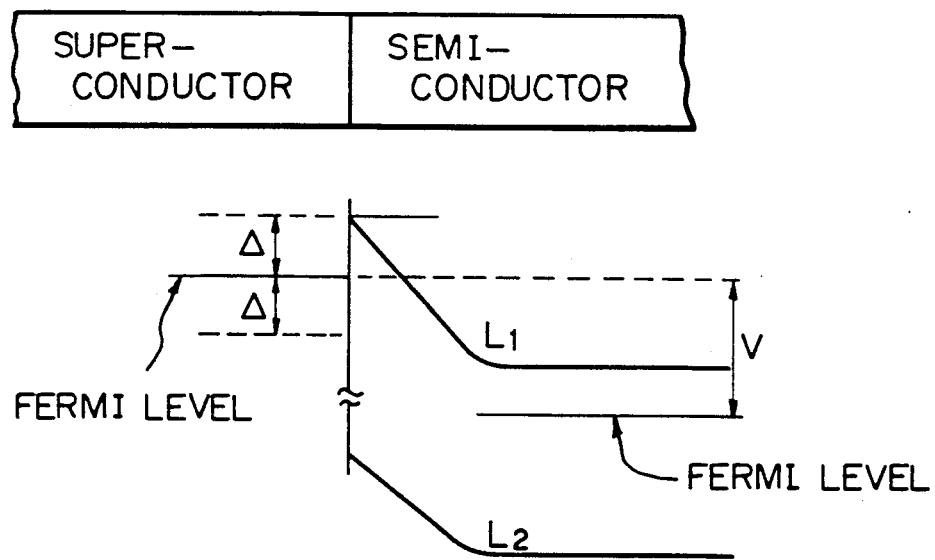
FIG. 1 is an energy diagram explaining the principle of a superconducting device possessing a quasiparticle collector junction according to the present invention.

Before explaining the preferred embodiments of the present invention, the reason why a quasiparticle collector having a high transmission probability of quasiparticles is used in the present invention will be explained.

The Gray's transistor and the Quiteron use a tunnel junction having an insulator as a barrier layer at a portion corresponding to the quasiparticle collector of the present invention. When quasiparticles are emitted to such a tunnel junction, the probability of transmission of the quasiparticles through the barrier due to the tunnel effect is generally considerably small, e.g., from approximately $10^{-5}$ to $10^{-10}$. Therefore, to achieve substantially the same level of quasiparticle current flowing in the barrier for output as the quasiparticle current injected from an injecting electrode, the number of quasiparticles incident on the tunnel junction per unit time must be $10^5$ to $10^{10}$ times the number of injected quasiparticles per unit time. To increase the number of the quasiparticles incident, the quasiparticle density in the superconductor may be increased. Thus, both Gray's superconducting transistor nd the Quiteron have been designed to effectively increase the quasiparticle density in the superconductor as much as possible by the injection current.

Gray's superconducting transistor uses aluminum, in which the relaxation time of the quasiparticles is long. Use is also made of the quasiparticle multiplication effect, wherein high energy quasiparticles are injected and each injected quasiparticle excites a plurality of quasiparticles, thus increasing the quasiparticle density. In such a case, the amplification factor of the output current with respect to the input current never exceeds the amplification factor of the quasiparticles. Also, the effect on changing the energy gap is very small, so that the multiplication factor of the quasiparticles is less than the ratio of the input voltage to the energy gap voltage. Namely, to obtain the current multiplication factor, a bias voltage of two to three times or more that of the gap voltage must be applied.

On the other hand, since the voltage to be used as a load is smaller than the gap voltage, the output of Gray's transistor cannot drive other devices.

The Quiteron uses the reduction of the energy gap by the injection of the quasiparticles. Use of the change of the energy gap enables efficient attainment of a large quasiparticle multiplication factor. Thus, the Quiteron features a larger current amplification factor than Gray's transistor.

In this case, as described in Japanese Unexamined Patent Publication (Kokai) No. 57-12575, the quasiparticle energy must be high to efficiently change the energy gap. This means that a high input bias voltage is required, as in Gray's transistor. In turn, the output voltage in the Quiteron is substantially the same as the energy gap voltage, and therefore it is also difficult to drive other devices by the Quiteron.

Further, in the Quiteron and Gray's transistors, wherein a tunnel junction is used as a junction for an output, there is the problem that the operating speed is determined by the recombination time of the quasiparticles. The problem derives from the fact that since the effective quasiparticle transmission probability in the tunnel junction is extremely low, the speed of relaxation of the quasiparticle density in the superconductor becomes substantially the same as the recombination time of the quasiparticles. The substantial recombination time of the quasiparticles is usually a few hundred psec or more.

The superconductor device of the present invention, on the other hand, uses a quasiparticle collector junction. The capture probability, i.e., transmission probability of the quasiparticles, is large as compared to that of the tunnel junction. In practice, a capture probability of $10^{-3}$ or more is needed. The transmission probability of the quasiparticle collector junction is ideally 1, $10^5$ to $10^7$ times that of a tunnel junction. The quasiparticle collector junction of the present invention does not just have a high quasiparticle transmission probability. If only a high transmission probability were required, a tunnel junction having an extremely thin barrier thickness could be used. However, if a bias were applied to such a tunnel junction, not only would the quasiparticles in the superconductor escape outside the tunnel junction, but also a large amount of the quasiparticle current would flow into the superconductor. The quasiparticle would current thus exist regardless of the quasiparticle injection from the electrode for injection of the quasiparticles. Further, in a tunnel junction with a high transmission probability, an extremely large quasiparticle current is generated by a small voltage. Thus, in a device which has a thin tunnel barrier as a junction for an output, the output signal cannot be controlled by the input signal.

Another feature of the quasiparticle collector junction in the present invention is that almost no quasiparticle injection from the collector junction into the superconductor is carried out under usual bias conditions. This feature allows the quasiparticle collector junction of the present invention to function substantially the same as the collector junction of a semiconductor bipolar transistor. Quasiparticles injected from a contact portion for quasiparticle injection, hereinafter referred to as a quasiparticle emitter, pass through the superconductor, hereinafter referred to as the base, and through the quasiparticle collector, and then flow to an outer electrode. This operation is similar to that of a semiconductor bipolar transistor. Since the transmission probability of a quasiparticle collector is high in the superconductor of the present invention, the operating time of the device is not limited by the quasiparticle recombination time. The reason is that almost all the injected quasiparticles reach the quasiparticle collector junction after a very short time to flow out to an outer electrode. Since the speed of quasiparticles is of the order of a Fermi velocity, which is about $10^6$ m/sec, only about 0.1 psec is required to run through the usual base layer having a width of from 100 to 200 nm.

The feature of the present invention resides in that a semiconductor-superconductor contact having a low barrier height or a structure wherein a low barrier height material is sandwiched by a superconducting base and another metal electrode is used as a quasiparticle collector junction which captures quasiparticles with a high efficiency.

FIG. 1 is an energy diagram explaining the principle of a superconducting device possessing a quasiparticle collector junction according to the present invention.

As shown in FIG. 1, the superconductor is in contact with a semiconductor, and a b height $\psi$ measured from the Fermi level the superconductor is formed at the contact portion. In this case, the energy gap $\Delta$ is used in place of $\psi$ for simplification.

Now, a positive voltage as compared with the superconductor is applied to the semiconductor.

The process wherein an electron maintained at a quasiparticle state in the superconductor is emitted to the semiconductor will be explained below.

This electron is maintained at an energy level higher than the Fermi level of the superconductor by the energy increment E, E being the excited energy of the quasiparticle and being larger than the energy gap $\Delta$. Thus, the electron freely flows over the barrier into the semiconductor. On the other hand, in the semiconductor, an electric field directed to a direction which draws the electron from the junction is maintained. Thus, electrons in the quasiparticle state incident on the collector junction are captured and flow out to the semiconductor.

The process wherein superconducting Cooper pairs in the superconductor are broken and the obtained electrons, maintained at the quasiparticle state, are transmitted to the semiconductor will be explained. Such electrons transmitted to the semiconductor are maintained at an energy level lower than the Fermi energy by E. If this level is in the forbidden band or if the height of the barrier is sufficiently greater than this level, such an electron moving process does not occur. Thus, the Cooper pairs, which exist as so-called majority carriers in the superconductor, do not contribute to the current of the quasiparticle collector junction. The electrons which contribute to the current of the quasiparticle collector junction are the quasiparticles injected from the quasiparticle emitter junction and quasiparticles generated by excitation by photons in the base region.

Figure 2A:
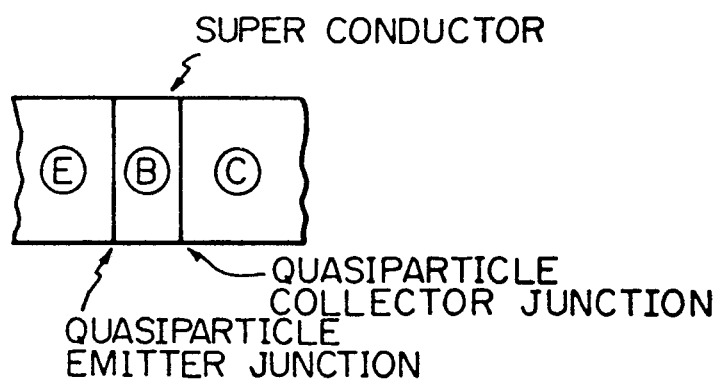
FIG. 2A is a diagram explaining the principle of a superconducting device possessing a quasiparticle emitter junction and a quasiparticle collector junction according to the present invention.

FIG. 2A is a diagram explaining the principle of a superconducting device possessing a quasiparticle emitter junction and a quasiparticle collector junction according to the present invention.

As shown in FIG. 2A, a thin superconducting base layer B composed of, for example, Nb, is sandwiched between a quasiparticle collector junction and a quasiparticle emitter junction. The emitter, shown by $E_1$ and the collector, shown by $C_1$ are both made of InSb.

Figure 2B:
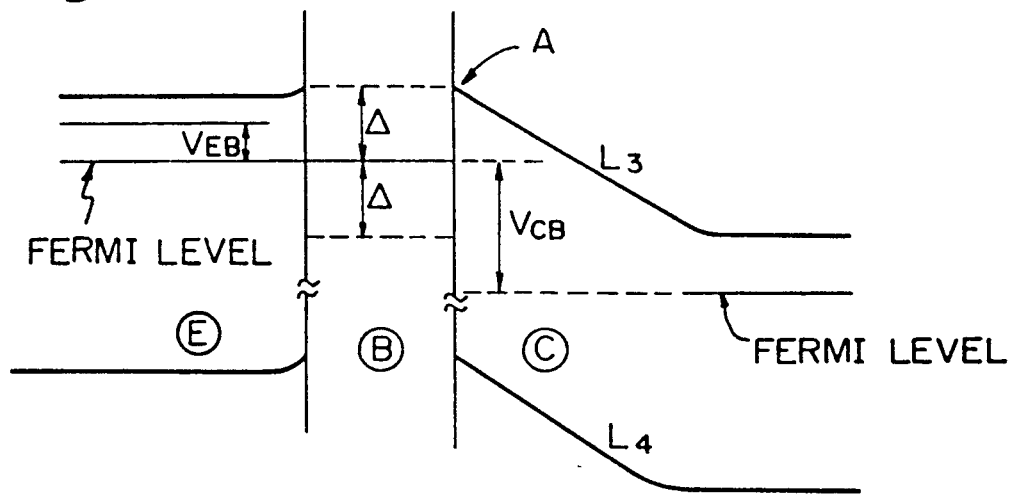
FIG. 2B is an energy diagram explaining the operating principle of FIG. 2A.

FIG. 2B is an energy diagram explaining the operating principle of FIG. 2A.

The quasiparticle emitter E is biased with a negative voltage $V_{EB}$ of about 1.5 to 2 mV at the side of the semiconductor. A collector-base voltage $V_{CB}$ is about 4 mV. Almost all the electrons in the quasiparticle state injected from the quasiparticle emitter E flow into the quasiparticle collector junction. A part of this is recombined to form Cooper pairs and flows out of the base electrode (not shown).

Thus, if the quasiparticle emitter current is expressed as $I_E$, the quasiparticle collector current $I_C$ can be defined by the following expression (1).

$$I_C = \alpha I_E + I_{sat} \quad (1)$$

wherein $\alpha$ is a current transfer coefficient. The time for which injected quasiparticles stay in the base region before capture by the quasiparticle collector junction can be determined by the time in which the quasiparticles run in the base region. This time is assumed to be about 0.1 psec, as mentioned above. The staying time in the base region is slightly increased by scattering of the quasiparticles in the base region, or by the transmission probability of the quasiparticle collector junction when that factor is less than 1. On the other hand, the recombination time of quasiparticles is at least a few hundred psec to a few nsec, which is two to three orders larger than the staying time in the base region. Consequently, it is assumed that almost all the quasiparticles flow into the quasiparticle collector C without recombination. Thus, the value $\alpha$ becomes nearly 1.

The above expression (1) means that the superconducting device according to the present invention functions similarly to a semiconductor bipolar transistor. Since $\alpha$ is nearly 1, a large current amplification factor can be obtained by an emitter-ground circuit system.

As explained above, the superconducting device of the present invention does not essentially require a change in the energy gap for operation. Further, the time during which quasiparticles stay in the base region is very short, enabling high speed operation. The working voltage is a few millivolts, and the power is considerably small.

Figure 2C:
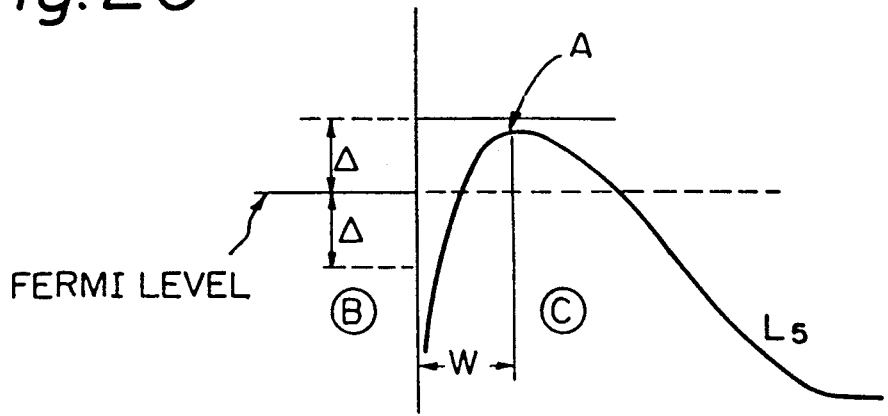
FIG. 2C is an energy diagram explaining the barrier height.

FIG. 2C is an energy diagram explaining the barrier height. The barrier height $\psi$ is shown by the energy gap $\Delta$ from the Fermi level in the superconductor for simplification in FIGS. 1 and 2B, but the actual state of the barrier height is shown in FIG. 2C. Namely, the curve $L_1$ in FIG. 1 and the Curve $L_3$ in FIG. 2B actually correspond to the curve $L_5$ in FIG. 2C. In FIG. 2C, the barrier height is defined as the height from the Fermi level in the base region to a portion A in the collector, the highest portion in the curve $L_5$. The highest portion A is lower than the energy gap $\Delta$ level. Further, the width W between the quasiparticle collector junction and a vertical line on which the portion A is located has to be smaller than the mean free path of the electrons in the semiconductor to efficiently capture quasiparticles with the collector region C.

Figure 2D:
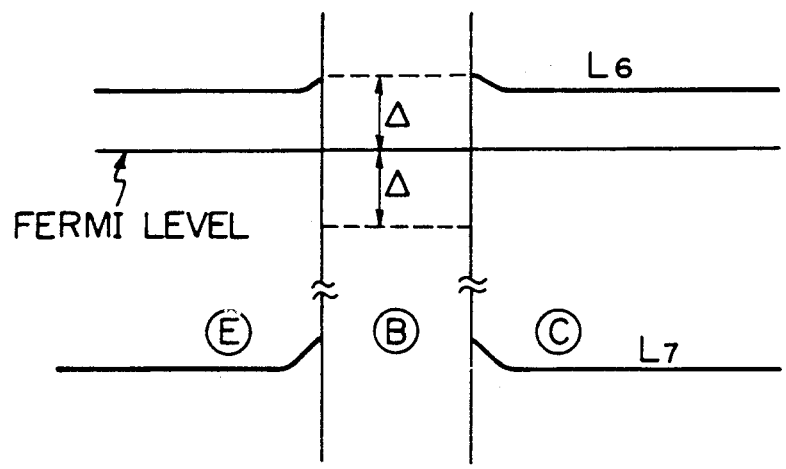
FIG. 2D is an energy diagram in the absence of biases.

FIG. 2D shows an energy diagram in the absence of biases. As shown in FIG. 2D, the energy level in the emitter E is substantially the same as that in the collector C.

Figure 3:
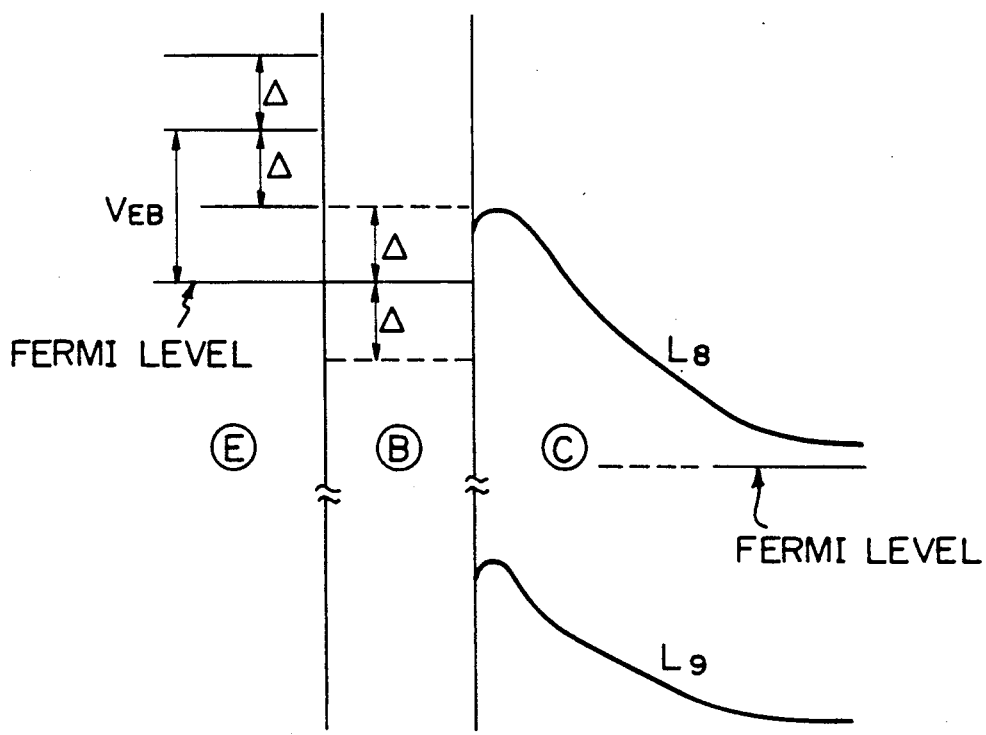
FIG. 3 is an energy diagram explaining a structure wherein an emitter region and a base region are made of superconductors.

FIG. 3 is an energy diagram explaining a structure wherein the emitter region E and the base region B are made of superconductors. In FIG. 3, a base-collector bias $V_E$ is applied.

Embodiments of the present invention will now be described.

Figure 4:
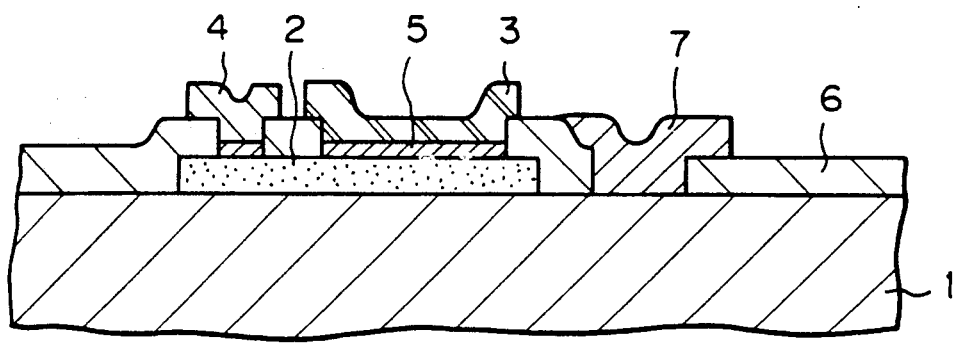
FIG. 4 is a cross-sectional view of an embodiment of the present invention.

FIG. 4 is a cross-sectional view of an embodiment of the present invention.

In FIG. 4, a semiconductor substrate 1 made of, for example, GaAs, InP, InAs, or InSb is overlaid with a thin film 2 made of a superconductor, for example, Pb alloy, Nb, or NbN. The barrier height of the superconductor-semiconductor contact portion is considerably low, namely the top of the barrier is substantially at the same height as the top of the energy gap, the illustrated embodiment showing the top of the barrier to be just below the top of the energy gap. On the superconductor thin film 2 a tunnel oxide film 5 is formed through a window formed in an insulating layer 6, for example, a vapor-deposited SiO film or an $SiO_2$ film deposited by a chemical vapor deposition (CVD) process, a sputtering process, or the like. Further, the tunnel oxide film 5 has formed on it an electrode 3 for injecting quasiparticles and an electrode 4 for base bias. The electrode 3 is composed of aluminum, molybdenum, or the like, which are normally conducting metals, and the electrode 4 is composed of a superconductor, for example, Pb alloy or Nb.

Between the superconductor of the electrode 4 and the superconductor thin film 2, which operate as a base, a Josephson junction is formed. No electric potential is generated by the usual base current. A collector electrode 7 is connected to the semiconductor substrate 1 by an ohmic contact.

In this embodiment, the thickness of the base region is easily reduced. Thus, a high current transfer function and a small base-ground saturated current $I_{sat}$ can be realized. In turn, since a tunnel junction is present between the base bias electrode and the base region, transfer of the quasiparticles from the base bias electrode to the base region may be decreased, whereby $I_{sat}$ is advantageously lowered. The quasiparticle capture probability is about $10^{-2}$ in the embodiment of FIG. 4.

Figure 5:
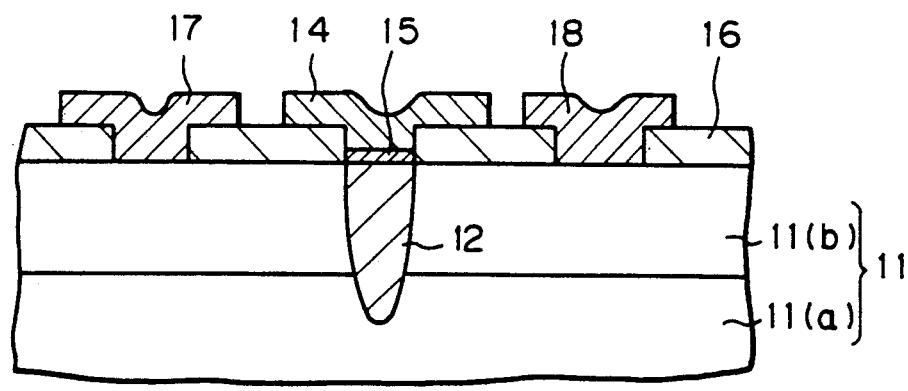
FIG. 5 is a cross-sectional view of another embodiment of the present invention.

FIG. 5 shows another embodiment of the present invention. As shown in FIG. 5, a superconductor 12 acting as a base region is buried in a small-width groove formed in a semiconductor substrate 11. The semiconductor substrate 11 has a layer 11(a) having insulation characteristics at an operating temperature of about 4.2 K and an active layer 11(b). The groove formed in the semiconductor substrate 11 isolates the active layer 11(b). A superconductor 14 contacts the superconductor 12 through a tunnel oxide film 15, forming a Josephson junction. The superconductor 14 works as a base electrode in this device. Ohmic electrodes 17 and 18 are provided as an emitter electrode and a collector electrode on the surface of the semiconductor substrate 11. The quasiparticle capture probability is about $10^{-2}$ in the device of FIG. 5.

In the embodiment of FIG. 5, a superconductor-semiconductor contact is used as a quasiparticle emitter. Since the superconductor-semiconductor contact has a small capacitance, the charging and discharging times of the emitter are short, enabling the device to be advantageously operated at a high speed.

In the present invention, the superconductor used as the base region may be composed of superconducting layers including metal layers.

I claim:
1. A superconducting device comprising:
   an insulating substrate;
   an active semiconductor layer formed on said insulating substrate and having a window formed therein;
   a base region formed of a superconductor in said window in said active semiconductor layer;
   a tunnel oxide layer formed on said superconductor at the top of said window;
   a superconductor electrode formed on said tunnel oxide layer;
   means, in contact with said base region, for injecting quasiparticles into said superconductor, including an emitter region formed of a first portion of said active semiconductor layer;
   a collector region, formed of a second portion of said active semiconductor layer, in contact with said base region and including a barrier layer formed on said superconductor for providing a barrier, said collector region capturing quasiparticles from said base region, and having a barrier height higher than the Fermi level of said base region for substantially blocking Cooper pairs from said base region and lower than the energy of the quasiparticles injected into said base region by said means for injecting quasiparticles, so that the injected quasiparticles pass over said barrier in said collector region, a normally conducting electrode being formed on said barrier layer, said barrier height of said barrier layer being substantially the same height as the energy gap of said superconductor.

* * * * *

UNITED STATES PATENT AND TRADEMARK OFFICE
CERTIFICATE OF CORRECTION

PATENT NO.   :   5,012,303
DATED        :   APRIL 30, 1991
INVENTOR(S)  :   HIROTAKA TAMURA

It is certified that error appears in the above-identified patent and that said Letters Patent is hereby corrected as shown below:

Col. 3,   line 57,   "would current thus exist" should be --current would thus exist--.

Col. 4,   line 33,   "a b height" should be --a barrier having a height--;

line 34,   "the superconductor" should be deleted.

Signed and Sealed this

Twenty-fourth Day of November, 1992

Attest:

DOUGLAS B. COMER

Attesting Officer

Acting Commissioner of Patents and Trademarks